(12) United States Patent
Krause et al.

(10) Patent No.: US 9,748,207 B2
(45) Date of Patent: Aug. 29, 2017

(54) BONDED DIES WITH ISOLATION

(71) Applicant: THE SILANNA GROUP PTY LTD, Eight Mile Plains, Queensland (AU)

(72) Inventors: Norbert Krause, Hawthorne (AU); Yashodhan Vijay Moghe, Marsfield (AU)

(73) Assignee: The Silanna Group Pty Ltd, Eight Mile Plains, Queensland (AU)

( * ) Notice: Subject to any disclaimer, the term of this patent is extended or adjusted under 35 U.S.C. 154(b) by 0 days.

(21) Appl. No.: 15/386,867

(22) Filed: Dec. 21, 2016

(65) Prior Publication Data

US 2017/0103969 A1 Apr. 13, 2017

Related U.S. Application Data

(63) Continuation of application No. PCT/IB2015/054673, filed on Jun. 22, 2015.

(60) Provisional application No. 62/015,986, filed on Jun. 23, 2014.

(51) Int. Cl.
| | |
|---|---|
| *H01L 21/02* | (2006.01) |
| *H01L 25/065* | (2006.01) |
| *H01L 25/00* | (2006.01) |
| *H01L 23/00* | (2006.01) |

(52) U.S. Cl.
CPC .......... *H01L 25/0657* (2013.01); *H01L 24/16* (2013.01); *H01L 24/32* (2013.01); *H01L 25/50* (2013.01); *H01L 2224/16145* (2013.01); *H01L 2224/32145* (2013.01); *H01L 2225/06531* (2013.01); *H01L 2225/06541* (2013.01)

(58) Field of Classification Search
CPC ..... H01L 25/0657; H01L 24/16; H01L 25/50; H01L 2224/16145; H01L 2224/32145; H01L 2225/06541; H01L 2225/06531
USPC ......................................................... 257/532
See application file for complete search history.

(56) References Cited

U.S. PATENT DOCUMENTS

| | | |
|---|---|---|
| 6,864,509 B2 | 3/2005 | Worley |
| 7,335,972 B2 | 2/2008 | Chanchani |
| 7,605,458 B1 | 10/2009 | Rahman et al. |
| 7,675,390 B2 | 3/2010 | Larson |
| 8,659,149 B2 | 2/2014 | French et al. |
| 2002/0071258 A1 | 6/2002 | Mosley |
| 2008/0277761 A1 | 11/2008 | Mahalingam et al. |
| 2009/0224364 A1 | 9/2009 | Oh et al. |
| 2012/0007251 A1 | 1/2012 | Hwang et al. |
| 2013/0043600 A1 | 2/2013 | Sadaka |

OTHER PUBLICATIONS

International Search Report and Written Opinion dated Sep. 25, 2015 for PCT Patent Application No. PCT/IB2015/054673.

*Primary Examiner* — Elias M Ullah
(74) *Attorney, Agent, or Firm* — The Mueller Law Office, P.C.

(57) ABSTRACT

An electronic circuit structure is formed with first and second dies bonded together. A first active layer is formed in the first die, and a second active layer is formed in the second die. The first and second dies are bonded together, with an isolation capacitor, through which the first and second active layers communicate, disposed between the first and second dies.

12 Claims, 3 Drawing Sheets

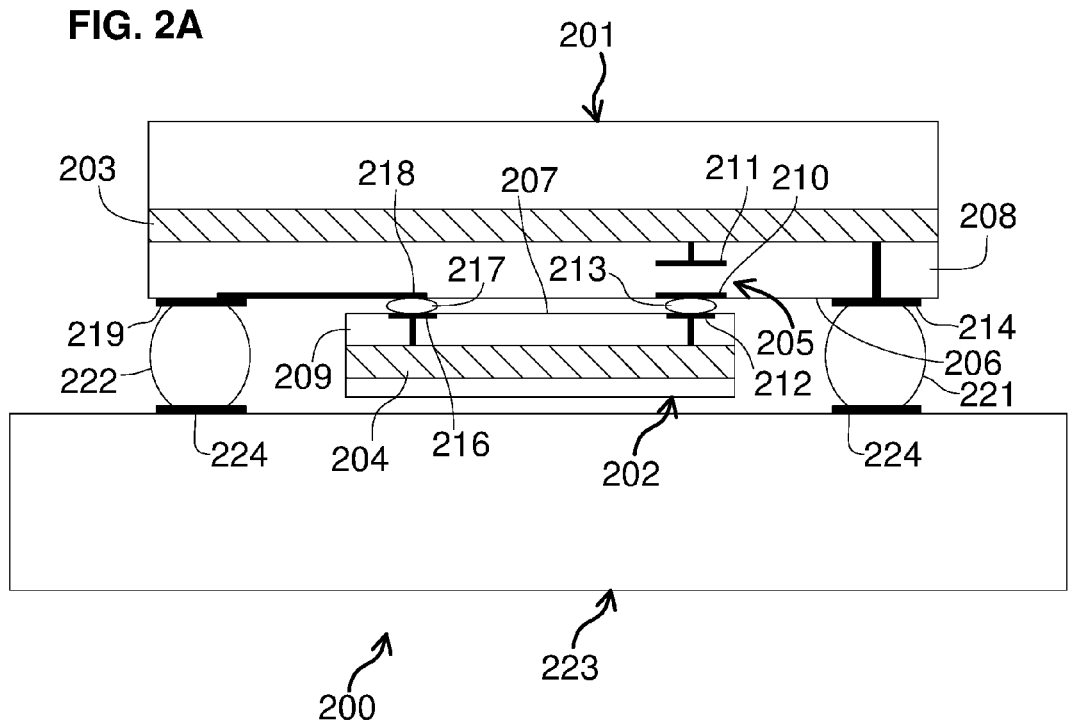

BONDED DIES WITH ISOLATION

CROSS REFERENCE TO RELATED APPLICATIONS

This application is a continuation of International Patent Application number PCT/IB2015/054673 filed on Jun. 22, 2015, entitled "Bonded Dies with Isolation", which claims priority to U.S. Provisional Patent Application No. 62/015,986 filed on Jun. 23, 2014, both of which are incorporated herein by reference.

BACKGROUND

When electronic circuits communicate with each other, electrical or galvanic isolation of the electronic circuits is sometimes essential to reduce or eliminate noise in the communication stream or to prevent malfunction of or damage to either electronic circuit due to a voltage spike from the other electronic circuit. Various types of galvanic isolation techniques have been created for various applications. Such isolation techniques may involve capacitive, inductive or optical isolation.

Capacitive isolation uses one or more capacitors to couple data signals across a capacitive barrier between electronic circuits. A time varying electric field transmits information across the capacitors. A dielectric material between the plates of the capacitor forms the isolation barrier.

An example capacitive isolation technique is illustrated with a circuit structure 100 in FIG. 1. The technique splits the different electronic circuits between separate dies 101 and 102 to ensure isolation between the circuits. A plate capacitor 103 on the first die 101 is connected via a bond wire 104 to the second die 102. In this manner, the electric coupling with galvanic isolation occurs within the plate capacitor 103. This technique requires a split paddle assembly package wherein the two dies 101 and 102 are mounted on separate carriers 105 and 106, respectively, within an overall IC package to further ensure electrical isolation. However, a generally weak signal and a large inductance of the bond wire 104 limit the speed of communication between the electronic circuits of the two dies 101 and 102.

An alternative solution incorporates the two circuits onto a single die, but on an isolating substrate, such as sapphire. The single die structure does not need a bond wire between the circuits, which helps reduce parasitic inductance, so the communication speed between the circuits can be enhanced. However, sapphire substrates are generally undesirable due to being relatively expensive.

SUMMARY

Some embodiments of the present invention involve an electronic circuit structure comprising first and second dies. The first die has a first active layer. The second die has a second active layer and is mounted onto a surface of the first die. An isolation capacitor, through which the first and second active layers communicate, is disposed between the first and second dies.

Some embodiments of the present invention involve a method for fabricating an electronic circuit structure. In the method, a first active layer is formed in a first die. A second active layer is formed in a second die. At least part of an isolation capacitor is formed at a surface of the first die. An electrical connection material is formed at a bonding surface of the second die. The second die is bonded onto the surface of the first die with the electrical connection material coupled to the isolation capacitor.

In some embodiments, the isolation capacitor is formed in an interconnect layer of the first die, with a capacitor plate in a topmost conductive layer of the interconnect layer. The second die is bonded to the first die at the capacitor plate.

In some embodiments, part of the isolation capacitor (e.g. a bottom capacitor plate) is formed in an interconnect layer of the first die, and part of the isolation capacitor (e.g. a top capacitor plate) is formed in an interconnect layer of the second die. The first and second dies are bonded at a dielectric between the two parts of the isolation capacitor.

DESCRIPTION OF DRAWINGS

FIG. 2A is a simplified cross section diagram of an alternative electronic circuit structure in accordance with an embodiment of the present invention.

DETAILED DESCRIPTION

Figure 2:
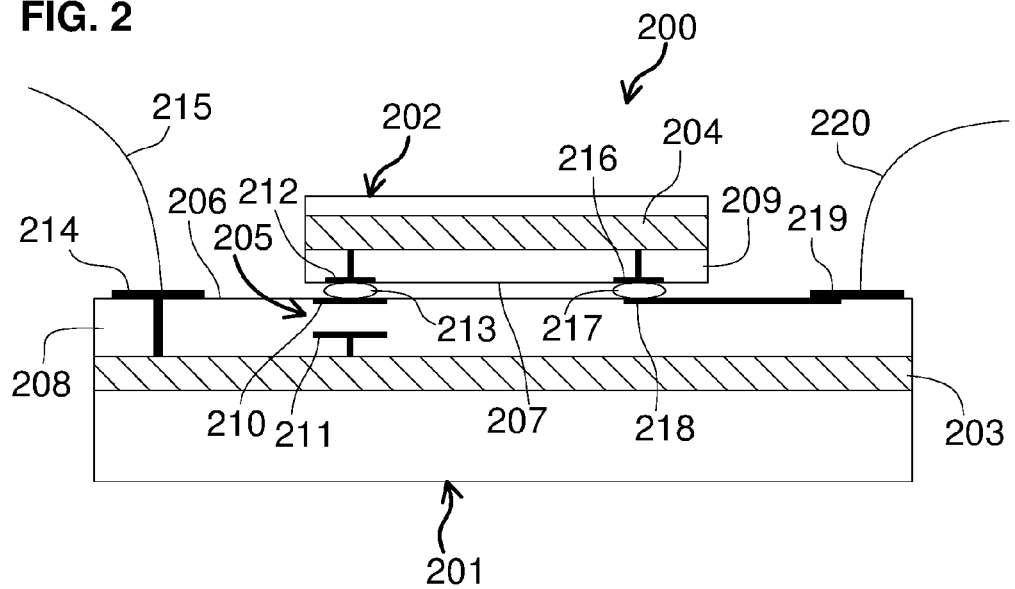
FIG. 2 is a simplified cross section diagram of an electronic circuit structure in accordance with an embodiment of the present invention.

An example of an electronic circuit structure 200 incorporating an embodiment of the present invention is shown in a cross section diagram in FIG. 2. Some components of the electronic circuit structure 200 are shown in a simplified or idealized form for ease of illustration and explanation, and some features that may be expected in such a structure have not been shown for simplicity. Additionally, the components of the electronic circuit structure 200 are not necessarily drawn to scale.

The electronic circuit structure 200 generally includes first and second (bottom and top) dies 201 and 202 bonded together. The first die 201 has a first active layer 203, and the second die 202 has a second active layer 204. The dies 201 and 202 are bonded "face-to-face" or "top-to-top" after one of them (e.g. 202) has been inverted.

The electronic circuit structure 200 also has an isolation capacitor 205 disposed between the first and second dies 201 and 202 within upper layers (e.g. at or near the top surface) of one of the two dies (e.g. as shown in die 201). The first and second active layers 203 and 204 communicate through the isolation capacitor 205. Additional similar isolation capacitors may also be included in the electronic circuit structure 200 for other communication paths between the two dies 201 and 202.

Figure 1:
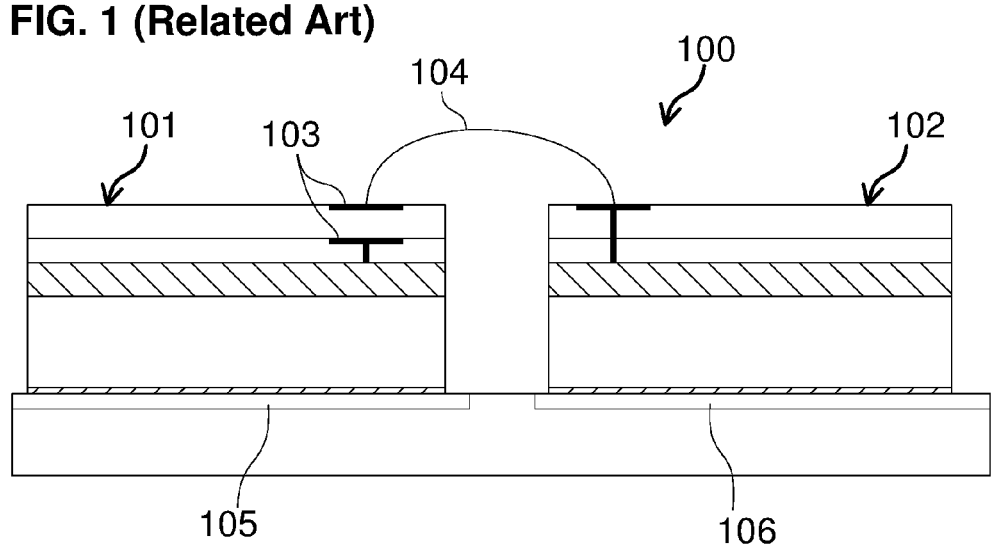
FIG. 1 is a simplified cross section diagram of a prior art electronic circuit structure.

Since the two dies 201 and 202 are bonded directly together at their top (or "bonding") surfaces 206 and 207, respectively, there is no need for the bond wire 104 of FIG. 1. (The surface 207 is the top surface of the top die 202 before the die 202 is inverted, but continues to be referred to herein as the "top surface", or alternatively as the "bonding surface", regardless of the orientation of the die 202.) With a direct bond, rather than a bond wire, the electronic circuit structure 200 can have a significantly lower inductance in its inter-die communication path, which allows for a higher communication speed, than that of the circuit structure 100 in FIG. 1. Additionally, the two dies 201 and 202 can be formed as standard CMOS dies. Therefore, there is no need for expensive sapphire substrates to ensure isolation between the two dies 201 and 202.

The two dies 201 and 202 also have interconnect layers 208 and 209, respectively. The interconnect layers 208 and 209 generally have multiple conductive layers separated by multiple insulating layers. The conductive layers are generally for routing signals through the dies 201 and 202 and may include any appropriate conductive materials, such as conventional metallization, redistribution layers (RDLs), and/or special-purpose conductive materials or layers.

The isolation capacitor 205 is shown with upper and lower electrically conductive plates 210 and 211 disposed within the interconnect layer 208 of the bottom die 201. In some embodiments, therefore, the electrically conductive plates 210 and 211 are formed from portions of the conductive layers of the interconnect layer 208, even within the RDL in some embodiments. One or more of the insulating layers of the interconnect layer 208 between the electrically conductive plates 210 and 211 may thus serve as the capacitor dielectric for the isolation capacitor 205. These insulating layers can include oxide, nitride, $Al_2O_3$, BCB (benzocyclobutene), polyimide or material combinations (e.g. BCB/oxide or PBO/oxide etc.). The polyimide solution, such as in an RDL, may provide a weaker dielectric than an oxide, but can be made relatively thick (e.g. 10-20 microns). The lower electrically conductive plate 211 is electrically connected to the active layer 203 in the bottom die 201.

In the illustrated embodiment, the upper electrically conductive plate 210 is exposed in a topmost conductive layer of the interconnect layer 208, any surrounding insulation or passivation material having been removed from above the upper electrically conductive plate 210 at the top surface 206 of the bottom die 201. Additionally, the top die 202 has an exposed electrically conductive pad or plate 212 in a topmost conductive layer of the interconnect layer 209. The two dies 201 and 202 are bonded by an electrically conductive material (e.g. a bump 213) that contacts the exposed electrically conductive plate 210 and the exposed electrically conductive pad 212. Additional similar exposed electrically conductive pads may also be included in the top die 202 for additional contacts (e.g. through additional bumps) to other isolation capacitors for other communication paths between the two dies 201 and 202. These bumps (e.g. 213) also mechanically bond the two dies 201 and 202 together.

For an external electrical connection for the bottom die 201, the illustrated embodiment includes exposed electrically conductive pads (e.g. 214) at the top surface 206 of the bottom die 201, any overlaying insulation or passivation material having been removed. In some embodiments, the exposed electrically conductive pad 214 is formed in an RDL of the bottom die 201. The exposed electrically conductive pad 214 is electrically connected to the active layer 203 in the bottom die 201. A bond wire 215 is connected to the exposed electrically conductive pad 214 for the external electrical connection for the bottom die 201.

On the other hand, for an external electrical connection for the top die 202, the illustrated embodiment includes exposed electrically conductive pads (e.g. 216) at the top/bonding surface 207 of the inverted top die 202, any overlaying insulation or passivation material having been removed. In some embodiments, the exposed electrically conductive pad 216 is formed in an RDL. The exposed electrically conductive pad 216 is electrically connected to the active layer 204 in the top die 202. Through another bump 217, the exposed electrically conductive pad 216 is electrically connected to an exposed electrically conductive pad 218 at the top/bonding surface 206 of the bottom die 201. The electrical connection is routed out from between the two dies 201 and 202 (e.g. through an RDL) to another exposed electrically conductive pad 219 at the top/bonding surface 206 of the bottom die 201. Another bond wire 220 is connected to the exposed electrically conductive pad 219 for the external electrical connection for the top die 202. In this manner, the electrical connections for the top die 202 are rewired to a free surface area of the bottom die 201. Additionally, the input and output contacts for the overall electronic circuit structure 200 are kept well apart in accordance with any high voltage requirements.

In an alternative embodiment as shown in FIG. 2A, the bottom die 201 and the top die 202 are mounted to each other in a configuration in which the larger die (bottom die 201) is a "mother" die and the smaller die (top die 202) is a "daughter" die. In this case, the daughter top die 202 is generally mounted, as shown and described above, to the surface 206 of the mother bottom die 201. Additionally, the mother bottom die 201 generally has ball, bump or pillar electrical connectors 221 and 222 on the surface 206, i.e., the same surface to which the daughter top die 202 is mounted. The ball, bump or pillar electrical connectors 221 and 222 are attached or formed, for example, at the exposed electrically conductive pads 214 and 219, which may be adapted as appropriate to support the ball, bump or pillar electrical connectors 221 and 222. Instead of being attached or mounted to a substrate in the upright configuration shown in FIG. 2, however, the mother bottom die 201 (now part of a mother/daughter assembly) is inverted and flip-chip mounted onto a substrate 223, such as a PCB, another die or other appropriate carrier. The ball, bump or pillar connectors 221 and 222 on the surface 206 of the mother bottom die 201 are generally thicker or taller than the daughter top die 202 in order to contact and be properly mounted to electrically conductive pads 224 on the substrate 223. The ball, bump or pillar connectors 221 and 222 on the surface 206 of the mother bottom die 201, thus, generally serve the same purpose as the bond wires 215 and 220 (FIG. 2) to provide the external electrical connections for the mother bottom die 201 and for the daughter top die 202 to or through the substrate 223 on which the assembly is mounted.

Figure 3:
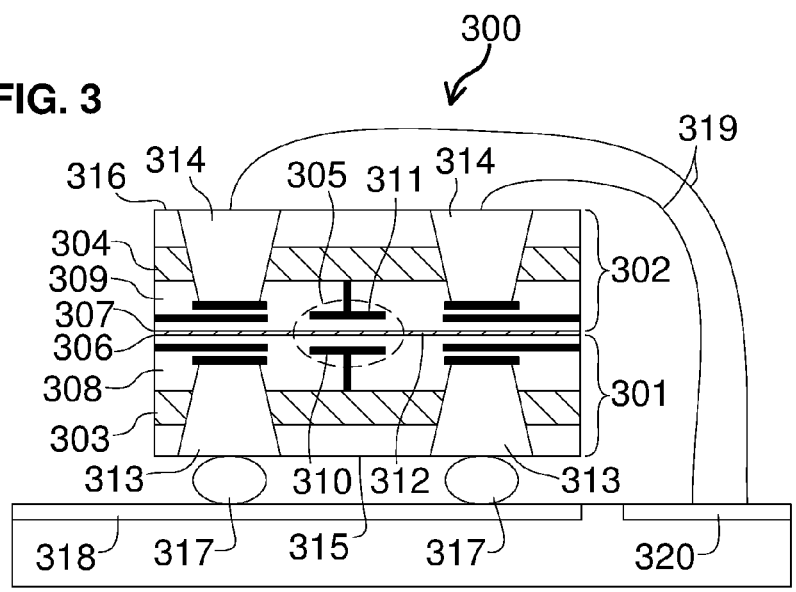
FIG. 3 is a simplified cross section diagram of an alternative electronic circuit structure in accordance with an embodiment of the present invention.

Another example of an electronic circuit structure 300 incorporating an alternative embodiment of the present invention is shown in a cross section diagram in FIG. 3. Again, some components of the electronic circuit structure 300 are shown in a simplified or idealized form for ease of illustration and explanation, and some features that may be expected in such a structure have not been shown for simplicity. Additionally, the components of the electronic circuit structure 300 are not necessarily drawn to scale.

The electronic circuit structure 300 generally includes first and second (bottom and top) dies 301 and 302 bonded together, e.g. by wafer-to-wafer bonding followed by dicing. The first die 301 has a first active layer 303, and the second die 302 has a second active layer 304. The dies 301 and 302 are bonded "face-to-face" or "top-to-top" after one of them (e.g. 302) has been inverted, but with no direct metal contacts between the two dies 301 and 302.

The electronic circuit structure 300 also has an isolation capacitor 305 disposed between the first and second dies 301 and 302 within upper layers of both of the two dies 301 and 302, such that the isolation capacitor 305 is split between the two dies 301 and 302. (The top die 302 has been inverted, but the "top" or "upper" portion of this die 302 is still referred to as such, even though it is oriented at the bottom due to the inversion.) The first and second active layers 303 and 304 communicate through the isolation capacitor 305. Additional similar isolation capacitors may also be included in the electronic circuit structure 300 for other communication paths between the two dies 301 and 302.

Since the two dies 301 and 302 are bonded directly together at their top (or "bonding") surfaces 306 and 307, respectively, there is no need for the bond wire 104 of FIG. 1. (The surface 307 is the top surface of the top die 302 before the die 302 is inverted, but continues to be referred to herein as the "top surface", or alternatively as the "bonding surface", regardless of the orientation of the die 302.) With a direct bond, rather than a bond wire, the electronic circuit structure 300 can have a significantly lower inductance in its inter-die communication path, which allows for a higher communication speed, than that of the circuit structure 100 in FIG. 1. Additionally, the two dies 301 and 302 can be formed as standard CMOS dies. Therefore, there is no need for expensive sapphire substrates to ensure isolation between the two dies 301 and 302.

The two dies 301 and 302 also have interconnect layers 308 and 309, respectively. The interconnect layers 308 and 309 generally have multiple conductive layers separated by multiple insulating layers. The conductive layers are generally for routing signals through the dies 301 and 302 and may include any appropriate conductive materials, such as conventional metallization, redistribution layers (RDLs), and/or special-purpose conductive materials or layers.

The isolation capacitor 305 is shown with a lower electrically conductive plate 310 disposed within the interconnect layer 308 (e.g. at or near the top/bonding surface 306) of the bottom die 301 and an upper electrically conductive plate 311 disposed within the interconnect layer 309 (e.g. at or near the top/bonding surface 307) of the top die 302. In some embodiments, therefore, the electrically conductive plates 310 and 311 are formed from portions of the conductive layers of the interconnect layers 308 and 309, respectively, even within the RDL in some embodiments. One or more of the insulating layers and/or overlaying passivation layers of the interconnect layers 308 and 309 between the electrically conductive plates 310 and 311 may thus serve as the capacitor dielectric for the isolation capacitor 305. These insulating layers can include oxide, nitride, $Al_2O_3$, BCB (benzocyclobutene), polyimide or material combinations (e.g. BCB/oxide or PBO/oxide etc.). The polyimide solution, e.g. in an RDL, may provide a weaker dielectric than an oxide, but can be made relatively thick (e.g. 10-20 microns). The lower electrically conductive plate 310 is electrically connected to the active layer 303 in the bottom die 301, and the upper electrically conductive plate 311 is electrically connected to the active layer 304 in the top die 302.

In the illustrated embodiment, the two dies 301 and 302 are shown bonded by an insulating adhesive material 312 disposed between the top/bonding surfaces 306 and 307. In this case, the insulating adhesive layer 312 also forms part of the capacitor dielectric between the lower and upper electrically conductive plates 310 and 311. In other embodiments, the two dies 301 and 302 may be bonded in any other appropriate manner (e.g. an oxide-to-oxide molecular, fusion or direct wafer bond using portions of the top insulating or passivation layers of the two dies 301 and 302).

For external electrical connections, the illustrated embodiment includes through-semiconductor-vias (TSVs) 313 and 314 in the two dies 301 and 302, respectively. The TSVs 313 and 314 generally extend from bottom surfaces 315 and 316 (i.e. surfaces opposite the top/bonding surfaces 306 and 307) of the two dies 301 and 302 (die 302 having been inverted), respectively, through the active layers 303 and 304 and into the interconnect layers 308 and 309. Each TSV 313 and 314 may be formed by bottom-side processing of the dies 301 and 302 to extend as far as is needed to make electrical contact within the active layers 303 and 304 and/or the conductive layers within the interconnect layers 308 and 309. At the bottom surfaces 315 and 316, the conductive material of the TSVs 313 and 314 is exposed for external electrical connections. The TSVs 313 of the bottom die 301, for example, are electrically connected via conductive bumps 317 to a carrier 318. The TSVs 314 of the top die 302, on the other hand, are electrically connected via bond wires 319 to another carrier 320. In this manner, the input and output contacts for the overall electronic circuit structure 300 are kept well apart in accordance with any high voltage requirements.

Figure 4:
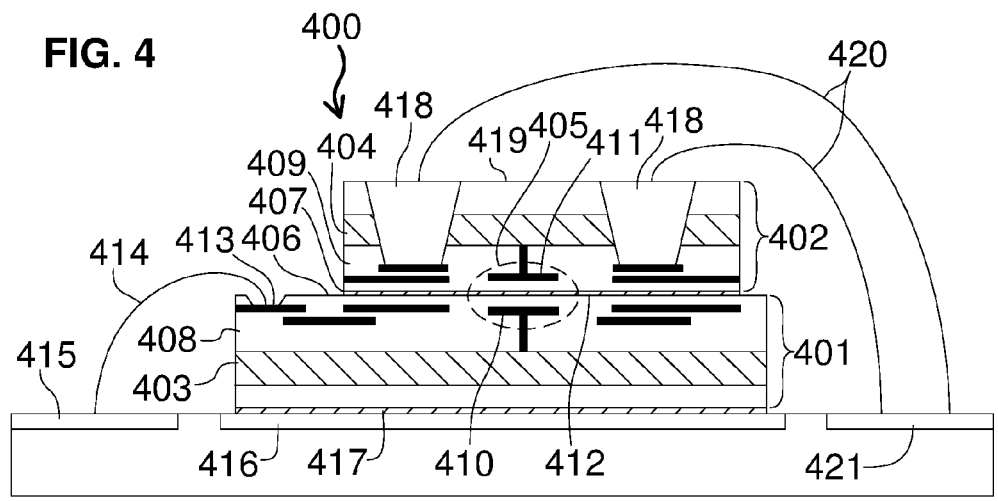
FIG. 4 is a simplified cross section diagram of another alternative electronic circuit structure in accordance with an embodiment of the present invention.

Another example of an electronic circuit structure 400 incorporating an alternative embodiment of the present invention is shown in a cross section diagram in FIG. 4. Again, some components of the electronic circuit structure 400 are shown in a simplified or idealized form for ease of illustration and explanation, and some features that may be expected in such a structure have not been shown for simplicity. Additionally, the components of the electronic circuit structure 400 are not necessarily drawn to scale.

The electronic circuit structure 400 generally includes first and second (bottom and top) dies 401 and 402 bonded together. The first die 401 has a first active layer 403, and the second die 402 has a second active layer 404. The dies 401 and 402 are bonded "face-to-face" or "top-to-top" after one of them (e.g. 402) has been inverted, but with no direct metal contacts between the two dies 401 and 402.

Similar to the electronic circuit structure 300 above, the electronic circuit structure 400 also has an isolation capacitor 405 disposed between the first and second dies 401 and 402 within upper layers of both of the two dies 401 and 402, such that the isolation capacitor 405 is split between the two dies 401 and 402. (The top die 402 has been inverted, but the "top" or "upper" portion of this die 402 is still referred to as such, even though it is oriented at the bottom due to the inversion.) The first and second active layers 403 and 404 communicate through the isolation capacitor 405. Additional similar isolation capacitors may also be included in the electronic circuit structure 400 for other communication paths between the two dies 401 and 402.

Since the two dies 401 and 402 are bonded directly together at their top (or "bonding") surfaces 406 and 407, respectively, there is no need for the bond wire 104 of FIG. 1. (The surface 407 is the top surface of the top die 402 before the die 402 is inverted, but continues to be referred to herein as the "top surface", or alternatively as the "bonding surface", regardless of the orientation of the die 402.) With a direct bond, rather than a bond wire, the electronic circuit structure 400 can have a significantly lower inductance in its inter-die communication path, which allows for a higher communication speed, than that of the circuit structure 100 in FIG. 1. Additionally, the two dies 401 and 402 can be formed as standard CMOS dies. Therefore, there is no need for expensive sapphire substrates to ensure isolation between the two dies 401 and 402.

The two dies 401 and 402 also have interconnect layers 408 and 409, respectively. The interconnect layers 408 and 409 generally have multiple conductive layers separated by multiple insulating layers. The conductive layers are generally for routing signals through the dies 401 and 402 and may include any appropriate conductive materials, such as conventional metallization, redistribution layers (RDLs), and/or special-purpose conductive materials or layers.

The isolation capacitor 405 is shown with a lower electrically conductive plate 410 disposed within the interconnect layer 408 (e.g. at or near the top/bonding surface 406) of the bottom die 401 and an upper electrically conductive plate 411 disposed within the interconnect layer 409 (e.g. at or near the top/bonding surface 407) of the top die 402. In some embodiments, therefore, the electrically conductive plates 410 and 411 are formed from portions of the conductive layers of the interconnect layers 408 and 409, respectively, even within the RDL in some embodiments. One or more of the insulating layers and/or overlaying passivation layers of the interconnect layers 408 and 409 between the electrically conductive plates 410 and 411 may thus serve as the capacitor dielectric for the isolation capacitor 405. These insulating layers can include oxide, nitride, $Al_2O_3$, BCB (benzocyclobutene), polyimide or material combinations (e.g. BCB/oxide or PBO/oxide etc.). The polyimide solution, e.g. in an RDL, may provide a weaker dielectric than an oxide, but can be made relatively thick (e.g. 10-20 microns). The lower electrically conductive plate 410 is electrically connected to the active layer 403 in the bottom die 401, and the upper electrically conductive plate 411 is electrically connected to the active layer 404 in the top die 402.

In the illustrated embodiment, the two dies 401 and 402 are shown bonded by an insulating adhesive material 412 disposed between the top/bonding surfaces 406 and 407. In this case, the insulating adhesive layer 412 also forms part of the capacitor dielectric between the lower and upper electrically conductive plates 410 and 411. In other embodiments, the two dies 401 and 402 may be bonded in any other appropriate manner, e.g. an oxide-to-oxide molecular, fusion or direct wafer bond using portions of the top insulating or passivation layers of the two dies 401 and 402.

For an external electrical connection for the bottom die 401, the illustrated embodiment includes exposed electrically conductive pads (e.g. 413) at the top surface 406 of the bottom die 401 where any overlaying insulation or passivation material has been partially removed. In some embodiments, the exposed electrically conductive pad 413 is formed in an RDL of the bottom die 401. The exposed electrically conductive pad 413 is electrically connected to the active layer 403 in the bottom die 401. A bond wire 414 is connected to the exposed electrically conductive pad 413 for the external electrical connection for the bottom die 401 to a left side carrier 415. The bottom die 401 is mounted or bonded to a center carrier or paddle 416 using any fastener (e.g. by an adhesive 417).

For an external electrical connection for the top die 402, the illustrated embodiment includes through-semiconductor-vias (TSVs) 418 in the die 402. The TSVs 418 generally extend from bottom surface 419 of the die 402 (die 402 having been inverted) through the active layer 404 and into the interconnect layer 409. Each TSV 418 may be formed by bottom-side processing of the die 402 to extend as far as is needed to make electrical contact within the active layer 404 and/or the conductive layers within the interconnect layer 409. At the bottom surface 419, the conductive material of the TSVs 418 is exposed for external electrical connections. The TSVs 418, for example, are electrically connected via bond wires 420 to a right carrier 421.

Embodiments in accordance with FIGS. 2 and 4 may involve situations where the top die 202/402 is not as wide as the bottom die 201/401 (i.e. the edges of the top die 202/402 are offset from the edges of the bottom die 201/401). The top die 202/402 may be made smaller than the bottom die 201/401 before die-to-die, or the top die 202/402 may be trimmed or recessed after wafer-to-wafer bonding (and after dicing in some embodiments). These embodiments may be used in situations where there is an isolation requirement that the minimum thickness of any single dielectric layer has to be greater than about 400 microns, e.g. for some medical isolators, in order to prevent a breakdown path through the packaging between the two dies 201/401 and 202/402. The recessed edge of the top die 202/402 may thus be at least 400 microns from the edge of the bottom die 201/401 in order to meet this requirement. The recessed edge of the top die 202/402 also enables the use of the bond wires 215, 220 and/or 414 for external electrical connections. In this manner, the input and output contacts for the overall electronic circuit structure 400 are kept well apart in accordance with any high voltage requirements.

Although embodiments of the present invention have been discussed primarily with respect to specific embodiments thereof, other variations are possible. Various configurations of the described system may be used in place of, or in addition to, the configurations presented herein.

Those skilled in the art will appreciate that the foregoing description is by way of example only, and is not intended to limit the present invention. Nothing in the disclosure should indicate that the present invention is limited to systems that require a particular form of semiconductor processing or to integrated circuits. In general, any diagrams presented are only intended to indicate one possible configuration, and many variations are possible. Those skilled in the art will also appreciate that methods and systems consistent with the present invention are suitable for use in a wide range of applications.

While the specification has been described in detail with respect to specific embodiments of the present invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. An electronic circuit structure comprising:
    a first die having a first active layer and a first interconnect layer on the first active layer;
    a second die having a second active layer and being mounted onto a surface of the first die; and
    an isolation capacitor disposed between the first and second dies and through which the first and second active layers communicate;
    wherein:
    the isolation capacitor includes a first electrically conductive plate in a topmost conductive layer of the first interconnect layer;
    the second die further has a second interconnect layer on the second active layer, including a second electrically conductive plate in a topmost conductive layer of the second interconnect layer; and
    the first and second dies are bonded by an electrically conductive material contacting the first electrically conductive plate and the second electrically conductive plate.

2. The electronic circuit structure of claim 1, wherein:
the topmost conductive layer of the first interconnect layer of the first die is a redistribution layer.

3. The electronic circuit structure of claim 1, wherein:
the first active layer and the second active layer electrically communicate with circuitry external to the electronic circuit structure through exposed pads on the first die.

4. The electronic circuit structure of claim 3, wherein:
the exposed pads on the first die are at the surface of the first die.

5. The electronic circuit structure of claim 1, further comprising:
electrical connectors on the surface of the first die with which the first die is flip-chip mounted onto a substrate.

6. An electronic circuit structure comprising:
a first die having a first active layer;
a second die having a second active layer and being mounted onto a surface of the first die; and
an isolation capacitor disposed between the first and second dies and through which the first and second active layers communicate;
wherein:
the first die further has a first interconnect layer on the first active layer;
the isolation capacitor includes portions of the first interconnect layer;
the first interconnect layer has first multiple conductive layers and first multiple insulating layers therein;
the isolation capacitor is formed of a portion of the first multiple conductive layers and a portion of the first multiple insulating layers;
the second die further has a second interconnect layer on the second active layer, the second interconnect layer having second multiple conductive layers and second multiple insulating layers therein; and
the first and second dies are bonded at portions of the first and second multiple insulating layers.

7. The electronic circuit structure of claim 6, wherein:
the isolation capacitor is partially disposed within a second interconnect layer of the second die.

8. The electronic circuit structure of claim 6, wherein:
the isolation capacitor has a first capacitor plate within the first multiple conductive layers, a second capacitor plate within the second multiple conductive layers, and a dielectric formed by the portions of the first and second multiple insulating layers at which the first and second dies are bonded.

9. An electronic circuit structure comprising:
a first die having a first active layer;
a second die having a second active layer and being mounted onto a surface of the first die; and
an isolation capacitor disposed between the first and second dies and through which the first and second active layers communicate;
wherein:
the first active layer electrically communicates with circuitry external to the electronic circuit structure through first exposed pads on a bottom surface of the first die opposite the surface; and
the second active layer electrically communicates with the circuitry external to the electronic circuit structure through second exposed pads on an exposed surface of the second die opposite a bonding surface of the second die that is bonded to the surface of the first die.

10. The electronic circuit structure of claim 9, wherein:
the first active layer is connected to the first exposed pads via first TSVs; and
the second active layer is connected to the second exposed pads via second TSVs.

11. A method for fabricating an electronic circuit structure, the method comprising the steps of:
forming a first active layer in a first die;
forming a first interconnect layer on the first die;
forming at least part of an isolation capacitor at a surface of the first die using the first interconnect layer, including a capacitor plate in a topmost conductive layer of the first interconnect layer;
forming a second active layer in a second die;
forming a second interconnect layer on the second die;
forming an electrical connection material at a surface of the second die, wherein the electrical connection material is a contact pad in a topmost conductive layer of the second interconnect layer; and
bonding the second die onto the surface of the first die with the electrical connection material coupled to the isolation capacitor by coupling the capacitor plate to the contact pad.

12. A method for fabricating an electronic circuit structure, the method comprising the steps of:
forming a first active layer in a first die;
forming a first interconnect layer on the first die;
forming at least part of an isolation capacitor at a surface of the first die by forming a first plate of the isolation capacitor in the first interconnect layer;
forming a first insulator layer over the first plate;
forming a second active layer in a second die;
forming a second interconnect layer on the second die;
forming a second plate of the isolation capacitor in the second interconnect layer;
forming an electrical connection material coupled to the isolation capacitor at a surface of the second die as a contact to the second plate;
forming a second insulator layer over the second plate; and
bonding the second die onto the surface of the first die at the first and second insulator layers.

* * * * *